United States Patent
Tsai et al.

[11] Patent Number: 5,937,291
[45] Date of Patent: Aug. 10, 1999

[54] METHOD FOR FORMING POLY-VIA CONNECTION BETWEEN LOAD TRANSISTOR DRAIN AND DRIVER TRANSISTOR GATE IN SRAM

[75] Inventors: Meng-Jin Tsai, Hsinchu Hsien; Kun-Cho Chen, Taichung Hsien, both of Taiwan

[73] Assignee: United Microelectronics Corp., Taiwan

[21] Appl. No.: 08/870,202

[22] Filed: Jun. 6, 1997

[30]     Foreign Application Priority Data

Apr. 2, 1997 [TW] Taiwan ................................. 86104248

[51] Int. Cl.$^6$ .............................................. H01L 21/8234
[52] U.S. Cl. ........................... 438/238; 438/241; 438/953; 438/152; 438/153
[58] Field of Search ................................ 438/238, 241, 438/953, 152, 153

[56]     References Cited

U.S. PATENT DOCUMENTS

| | | | |
|---|---|---|---|
| 5,654,239 | 8/1997 | Sakamoto | 438/491 |
| 5,702,988 | 12/1997 | Liang | 438/238 |
| 5,717,240 | 2/1998 | Kuriyama et al. | 257/370 |

*Primary Examiner*—John F. Niebling
*Assistant Examiner*—Lynne A. Gurley
*Attorney, Agent, or Firm*—Finnegan, Henderson, Farabow, Garrett & Dunner, L.L.P.

[57]     ABSTRACT

A manufacturing method applicable for forming a via connection to the thin film transistor in a SRAM unit which resolves the problems arising from a conventional method for forming a via for linking up the drain of a load transistor with the gate of a driver transistor in a SRAM unit by changing the processing sequence and also by forming a plug instead of a via.

15 Claims, 8 Drawing Sheets

METHOD FOR FORMING POLY-VIA CONNECTION BETWEEN LOAD TRANSISTOR DRAIN AND DRIVER TRANSISTOR GATE IN SRAM

BACKGROUND OF THE INVENTION

1. Field of Invention

This invention relates in general to a manufacturing method for connecting transistors in a static random access memory (SRAM) component, and, more particularly, to a method for forming a poly-via connection between the drain of a load transistor and the gate of a driver transistor in a SRAM component.

2. Description of Related Art

FIG. 1 shows the circuit layout of a SRAM unit 10. A SRAM unit consists of a first driver transistor Q1 and a second driver transistor Q2, which are both enhancement mode N-type metal-oxide-semiconductor (NMOS) transistors. The source terminal 12 of the driver transistor Q1 and the source terminal 14 of driver transistor Q2 are connected to a reference ground voltage source Vss, the drain terminal 16 of Q2 and the gate terminal 18 of Q1 are connected together, and similarly the drain terminal 20 of Q1 and the gate terminal 22 of Q2 are connected together. The SRAM unit 10 in FIG. 1 also includes two load transistors Q3 and Q4, which are for the prevention of charge leakages from the drains 16 and 20 of the driver transistors Q1 and Q2 respectively, and therefore the load can actually be either a polysilicon resistor or a PMOS device. In order to reduce the dimensions of a SRAM unit 10 so as to expand its field of applications, the level of integration must be increased while its standby current must be reduced. Hence, the load transistors Q3 and Q4, for example, are P-type thin film transistors (TFT) with their source terminals 24 and 26 connected together and to a reference voltage Vcc, and their drain terminals 28 and 30 connected to the drain terminal 20 of Q1 and the drain terminal 16 of Q2 respectively, while their gate terminals 44 and 46 are connected to the gate terminal 18 of Q1 and gate terminal 22 of Q2 respectively.

The SRAM unit 10 of FIG. 1 further includes two enhancement mode NMOS devices Q5 and Q6 which act as transfer transistors. The gate terminals 32 and 34 of both Q5 and Q6 are connected to a word line labelled WORD, the source terminals 36 and 38 of Q5 and Q6 are connected to bit lines labelled BIT and bar BIT, respectively, while the drain terminals 40 and 42 of Q5 and Q6 are connected to the drain terminal 20 of Q1 and the drain terminal 16 of Q2, respectively.

FIGS. 2a to 2d are a series of diagrams showing the manufacturing sequence for the formation of a poly-via connecting the drain terminal of a load transistor, for example, the drain terminal 30 of Q4, with the gate terminal of a driver transistor, for example, the gate terminal 18 of Q1, in a conventional SRAM unit. First, it must be realized that the respective gate terminals of P-type thin film transistors Q3 and Q4 use the same common gate terminals 18 and 22 as that of the respective gate terminals of the transistors Q1 and Q2 respectively, and furthermore, that the channel, the source terminal and the gate terminal of each of the transistors Q3 and Q4 are formed on the same layer. Cross-sectional views, as shown in FIGS. 2a through 2d, are actually a portion of the connecting leg corresponding to one of the connecting legs such as 50 in the SRAM unit of FIG. 1.

First, as shown in FIG. 2a, a cross-sectional structure 100 of SRAM near the connecting leg, for example, one of the connecting legs 50 of FIG. 1, including an N-type silicon substrate 112 and having a previously formed P-well 114 is provided. Then, N-doped N$^+$ source/drain regions 116 are formed inside the P-well 114 and are separated by a channel 118. Next, a first gate oxide layer 120 and a conducting layer 122 are sequentially formed above the P-well 114. The first gate oxide layer 120 can be, a silicon dioxide layer, for example, and the conducting layer 122 can be a polycide layer composed of a polysilicon layer and a silicide layer, for example.

Next in FIG. 2b, the conducting layer 122 is patterned, and then N-type ions 126 are doped to form an N$^+$ gate 124 above the channel 118. The N$^+$ source/drain regions 116 and the N$^+$ gate 124 are equivalent to the source terminal 12, the drain terminal 20 and the gate terminal 18, respectively of transistor Q1 in FIG. 1. Thereafter, a second gate oxide layer 128 with a thickness of about 50 Å to 400 Å, for example, is formed above the P-well, covering the N$^+$ source/drain regions 116 and the N$^+$ gate 124.

Subsequently, as shown in FIG. 2C, the second gate oxide layer 128 is defined and then etched to form a via 130 exposing part of the N$^+$ gate 124. Next, a polysilicon layer 132 covering the second gate oxide layer 128 and filling the via 130 is formed.

Finally, in FIG. 2d, P-type ions 134 are doped into the polysilicon layer 132, forming P$^+$ source/drain regions 136 of the thin film transistor, for example, like the drain terminal 30 of transistor Q4 in FIG. 1. Thereafter, an inter-layer dielectric (ILD) 138 layer is formed above the polysilicon layer 132, followed by subsequent processing necessary for the completion of SRAM.

However, the manufacturing method described above has a number of defects as follows:

1. In the conventional manufacturing process, the contact window opening is formed after the formation of a thin film transistor (TFT) gate oxide layer but before the formation of a TFT channel. Therefore the quality of the TFT gate oxide layer can be compromised as a result of pollutants from photolithographic processes, such as photoresist coating as well as subsequent etching.
2. Since the enhancement mode NMOS transistor, Q1 for example, and the thin film transistor, Q3 for example, both use a common gate, resistance in the via at the contacting point where the N$^+$ gate of an NMOS meets the P$^+$ source/drain region of a TFT will be affected.
3. For a similar reason as described in item number 2 above, because of the existence of a potential barrier in the N$^+$/P$^+$ interface of a via, signal transferring operation through the circuit will be affected adversely.

SUMMARY OF THE INVENTION

It is therefore an object of this invention to resolve the problems caused by the conventional method of forming a via to link up the drain of a load transistor with the gate of a driver transistor in a SRAM unit by changing the processing sequence, and also forming a plug instead of a contact window opening as in the conventional method.

The advantages and purpose of the invention will be set forth in part in the description which follows, and in part will be obvious from the description, or may be learned by practice of the invention. The advantages and purpose of the invention will be realized and attained by the steps and combinations particularly pointed out in the appended claims.

To attain the advantages and in accordance with the purpose of the invention, as embodied and broadly described herein, the invention involves a method for forming a via for linking up the drain of a load transistor with the gate of a driver transistor in a SRAM unit, comprising of the steps of: providing an N-type silicon substrate, and forming a P-well above the N-type silicon substrate having $N^+$ source/drain regions separated by a channel; forming a first gate oxide layer and a conducting layer sequentially above the P-well; defining a pattern on the conducting layer, and then doping N-type ions to form an $N^+$ gate above the channel; forming a second gate oxide layer and a polysilicon layer sequentially above the P-well; doping P-type ions into the source/drain regions to form $P^+$ source/drain terminals after the source/drain patterning; patterning the polysilicon layer and the second gate oxide layer so as to etch out an opening exposing part of the first gate layer; forming a metallic layer filling up the opening, and then etching back the metallic layer to form a metallic plug; and forming an inter-layer dielectric layer.

In another aspect, the advantages and purpose of the invention are realized and attained by a manufacturing method for forming a via connecting to the thin film transistor in a SRAM unit, comprising the steps of: providing an N-type silicon substrate, and forming a P-well above the N-type silicon substrate having $N^+$ source/drain regions separated by a channel; forming a first gate oxide layer and a conducting layer sequentially above the P-well; defining a pattern on the conducting layer, and then doping N-type ions to form an $N^+$ gate above the channel; forming a second gate oxide layer and a polysilicon layer sequentially above the P-well; doping P-type ions into the polysilicon layer to form $P^+$ source/drain terminals; forming an inter-layer dielectric layer above the polysilicon layer; patterning the inter-layer dielectric layer, the polysilicon layer and the second gate oxide layer so as to etch out an opening exposing part of the first gate layer; forming a metallic layer filling the opening, and then etching back the metallic layer to form a metallic plug; forming a another metallic layer followed by planarization thereof; and forming an inter-metallic dielectric layer above the metallic layer.

It is to be understood that both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
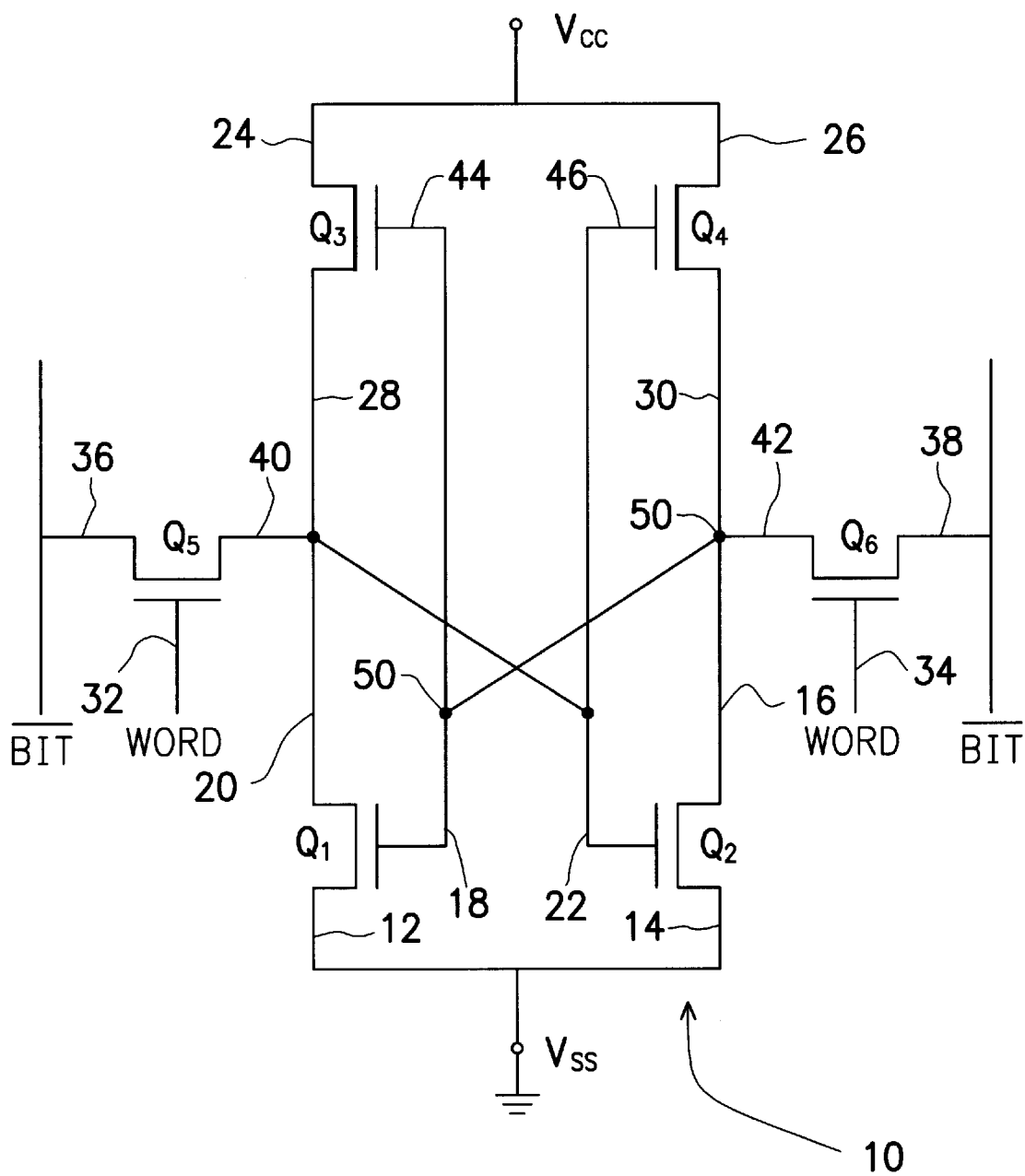
FIG. 1 is a circuit diagram of a SRAM unit.
Figure 2A:
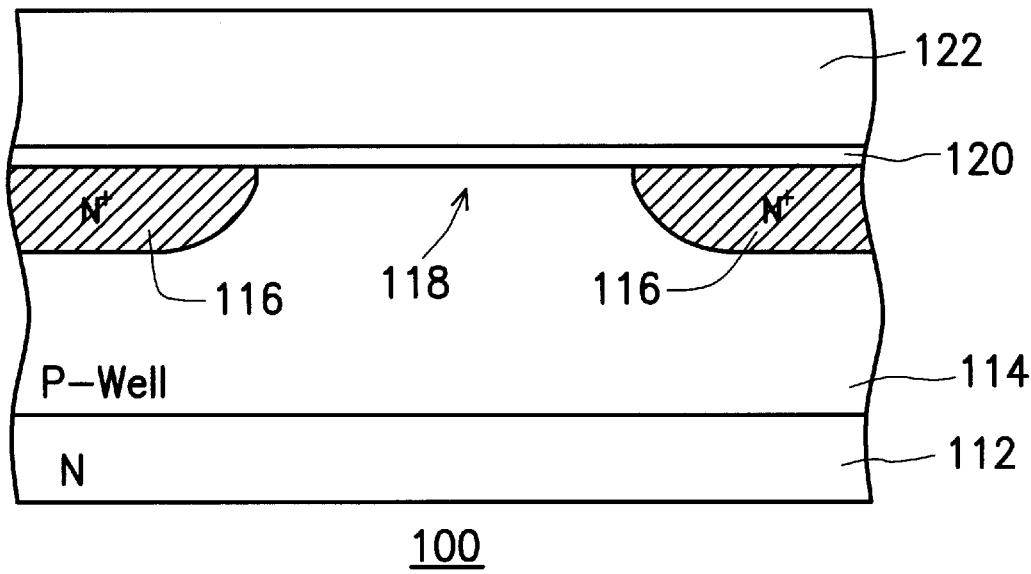
FIGS. 2a through 2d are a series of diagrams showing the conventional manufacturing flow of a via for linking up the drain of a load transistor with the gate of a driver transistor in a SRAM unit.
Figure 2B:
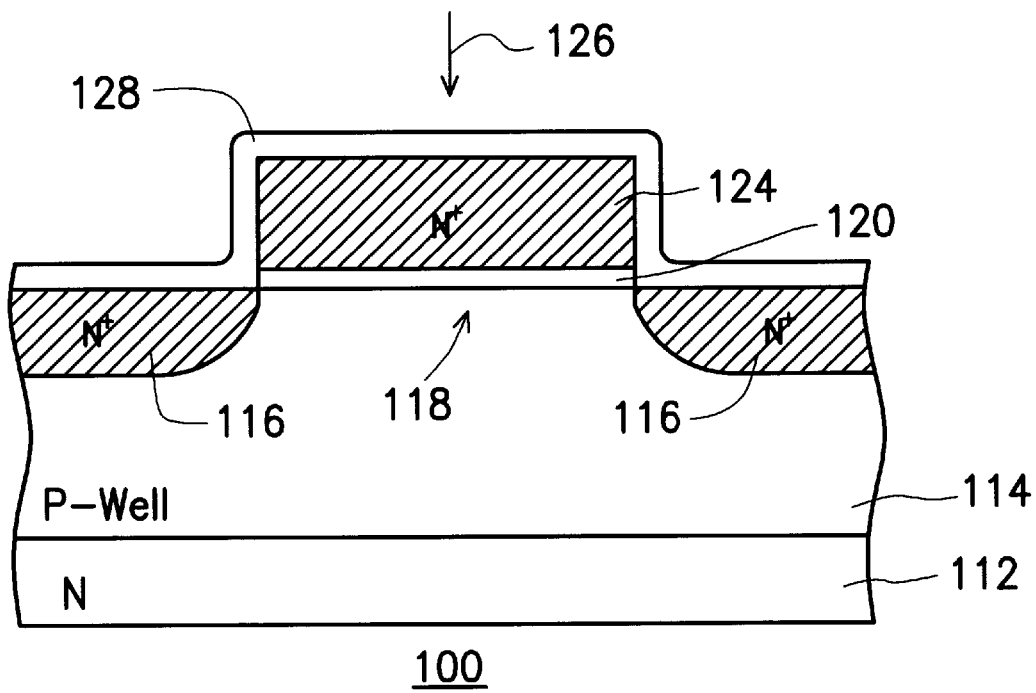
Figure 2C:
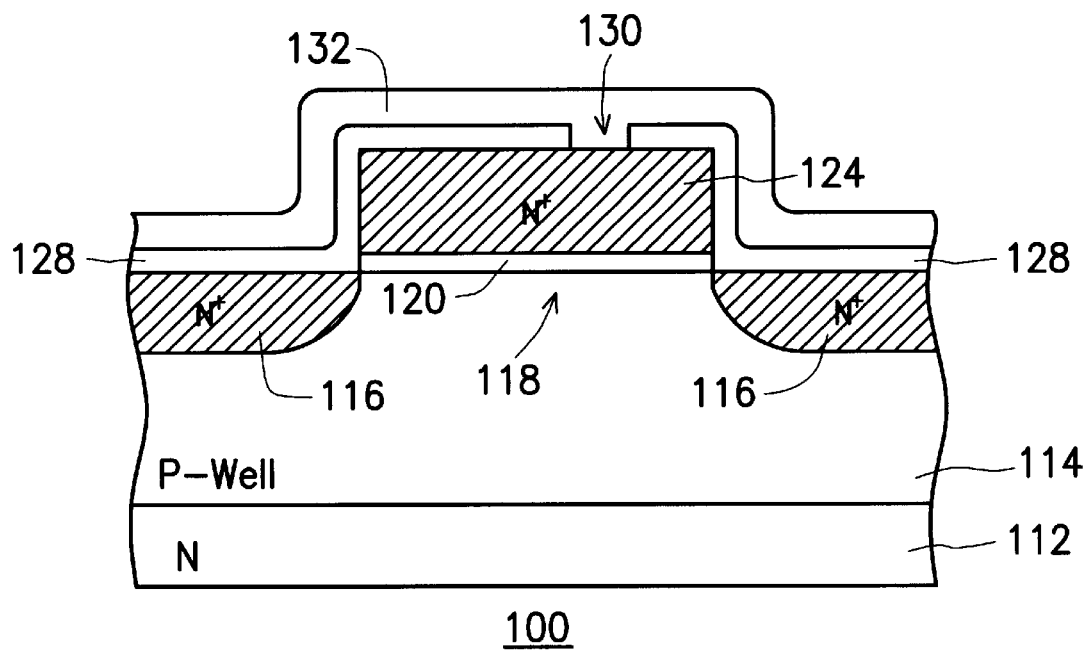
Figure 2D:
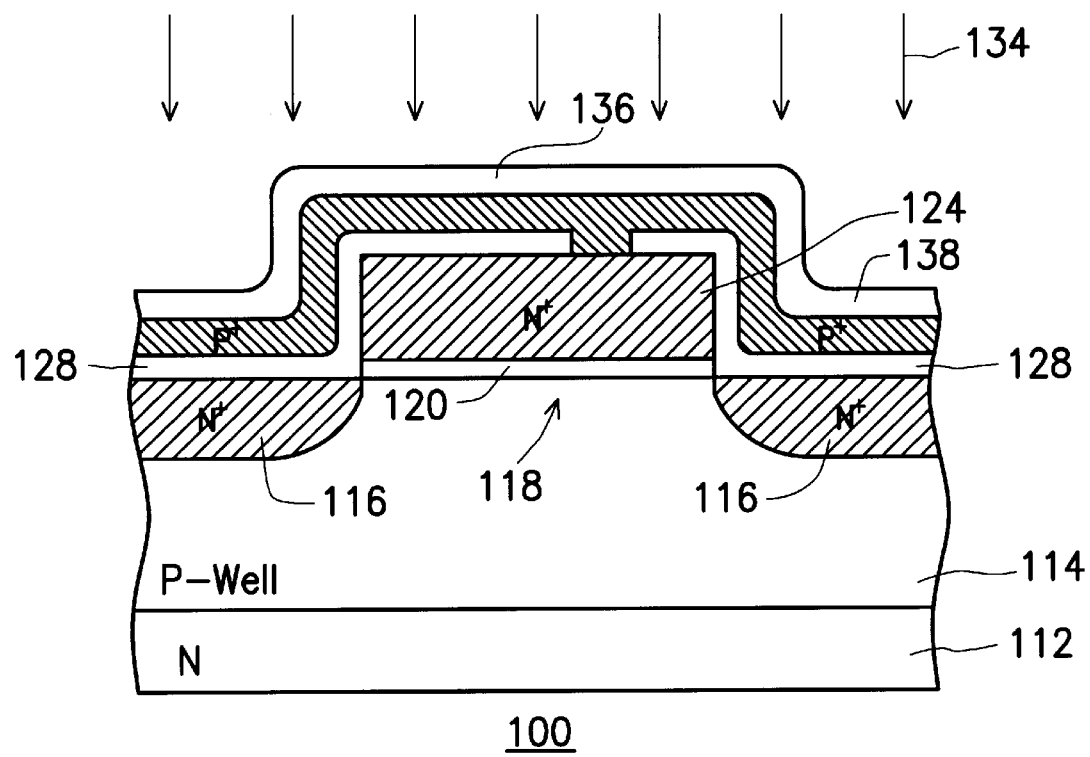
Figure 3A:
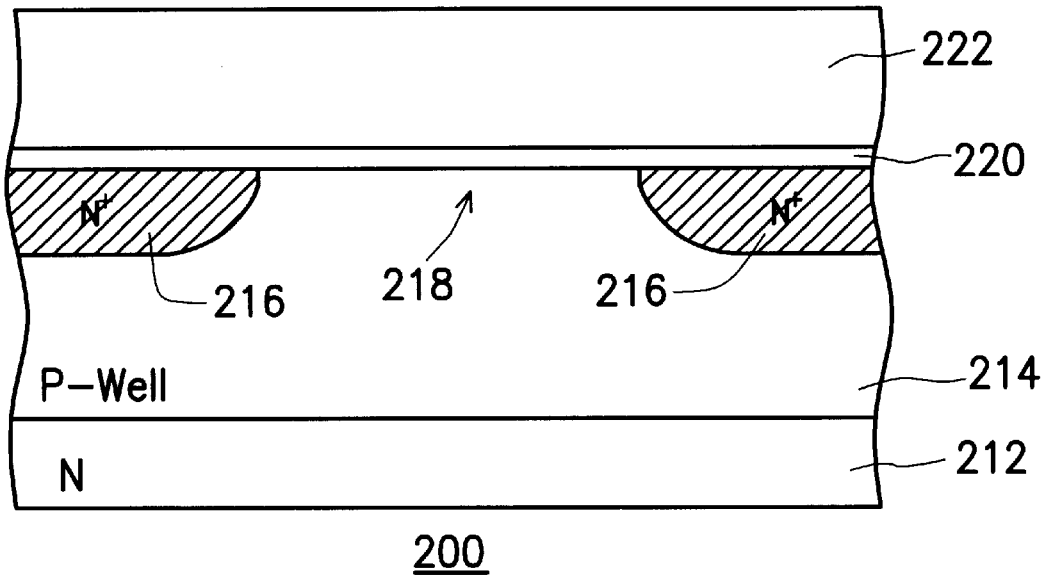
FIGS. 3a through 3d are a series of diagrams showing the method of forming a via for linking up the drain of a load transistor with the gate of a driver transistor in a SRAM unit according to a first preferred embodiment of this invention.

As shown in FIG. 3a, a cross-sectional structure 200 of SRAM near a connecting leg, for example, one of the connecting legs 50 in FIG. 1, including an N-type silicon substrate 212 and having a previously formed P-well 214 is provided. Then, N-doped $N^+$ source/drain regions 216 are formed inside the P-well 214 and are separated by a channel 218. Next, a first gate oxide layer 220 and a conducting layer 222 are sequentially formed above the P-well 214. The first gate oxide layer 220 can be a silicon dioxide layer, for example, and the conducting layer 222 can be a polycide layer composed of a polysilicon layer and a silicide layer, for example.

Figure 3B:
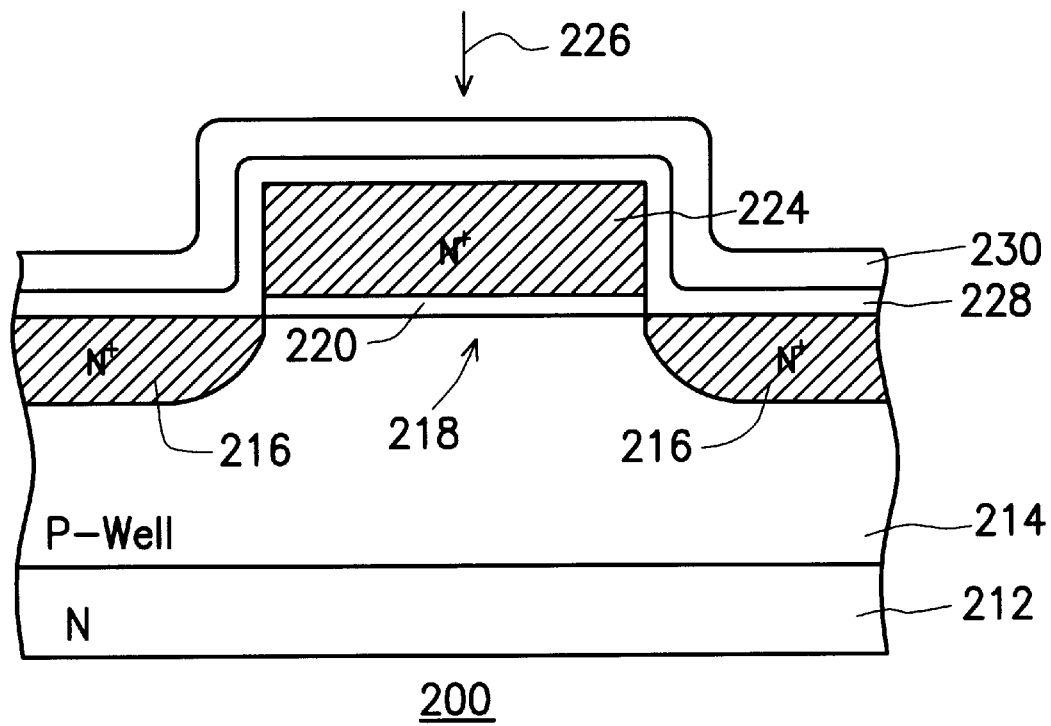

Next as shown in FIG. 3b, the conducting layer 222 is patterned, and then N-type ions 226 are doped to form an $N^+$ gate 224 above the channel 218. The $N^+$ source/drain regions 216 and the $N^+$ gate 224 are equivalent to the source terminal 12, the drain terminal 20 and the gate terminal 18 respectively of transistor Q1 in FIG. 1. Thereafter, a second gate oxide layer 228 and a polysilicon layer 230 are sequentially formed above the P-well. The second gate oxide layer 228 has a thickness of, for example, about 50 Å to 400 Å.

Figure 3C:
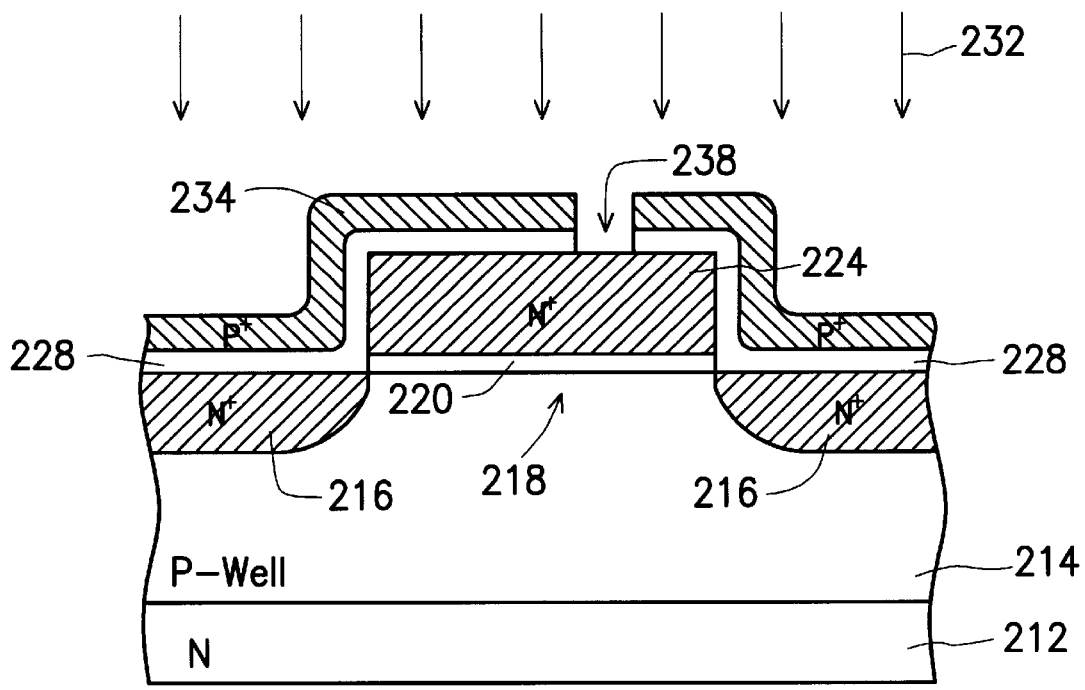

Subsequently, as shown in FIG. 3c, P-type ions 232 are doped into the polysilicon layer 230 forming $P^+$ source/drain regions 234 of the thin film transistor, for example, like the drain terminal 30 of transistor Q4 in FIG. 1. Then, the $P^+$ source/drain regions 234 and the second gate oxide layer 228 are patterned so as to etch out an opening 238 exposing part of the N gate layer 224.

Figure 3D:
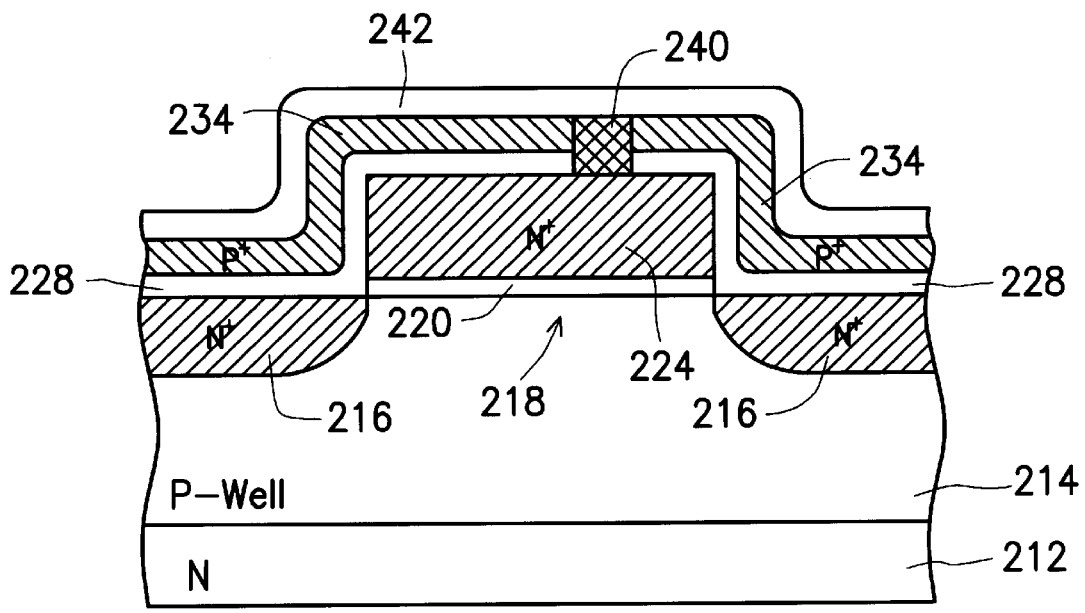

Finally, in FIG. 3d, a metallic layer (not shown in the figure), for example, a tungsten layer, is formed covering the polysilicon layer 230 and filling the opening 238. Next, the metallic layer is etched back using the polysilicon layer 230 as the etching stop layer to form a plug 240. Thereafter, an inter-layer dielectric (ILD) 242 is formed, followed by the subsequent back-end processes necessary for the completion of the SRAM component.

When the plug referred to in the described embodiment is formed simultaneously with the contact window of a metallization in the same process, one processing step can be eliminated, and moreover, the same photomask can be used for forming both the contact window and the plug, thus saving some cost in photomask production.

Figure 4A:
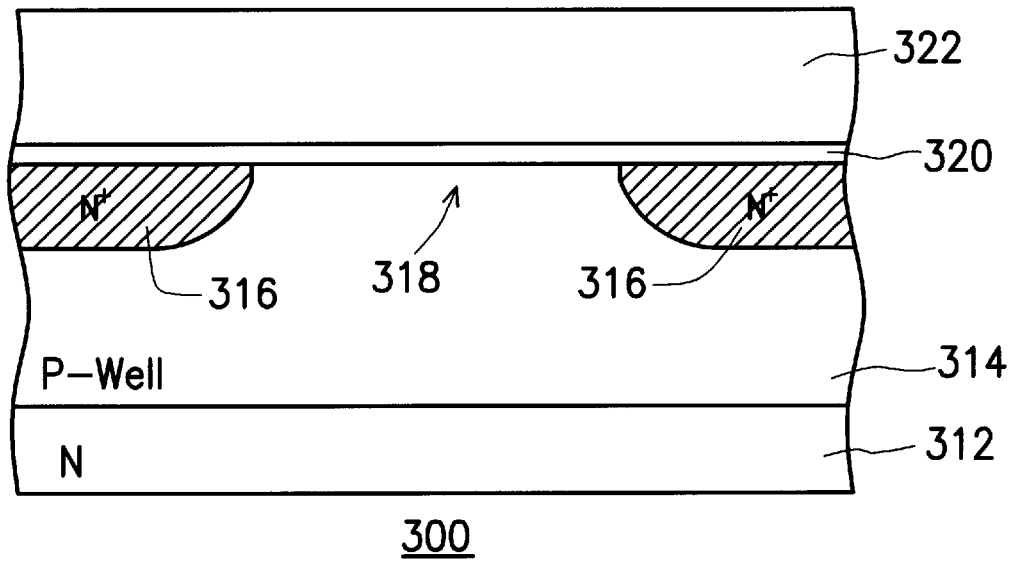
FIGS. 4a through 4f are a series of diagrams showing the method of forming a via for linking up the drain of a load transistor with the gate of a driver transistor in a SRAM unit according to a second preferred embodiment of this invention.

In a second embodiment of the invention—beginning with FIG. 4a, a cross-section 300 of the thin film transistor structure in a SRAM unit, including an N-type silicon substrate 312 and having a P-well 314 already formed, is provided. Then, N-doped $N^+$ source/drain regions 316 are formed inside the P-well 314 and separated by a channel 318. Next, a first gate oxide layer 320 and a conducting layer 322 are sequentially formed above the P-well 314. The first gate oxide layer 320 can be a silicon dioxide layer, for example, and the conducting layer 322 can be a polycide layer composed of a polysilicon layer and a silicide layer, for example.

Figure 4B:
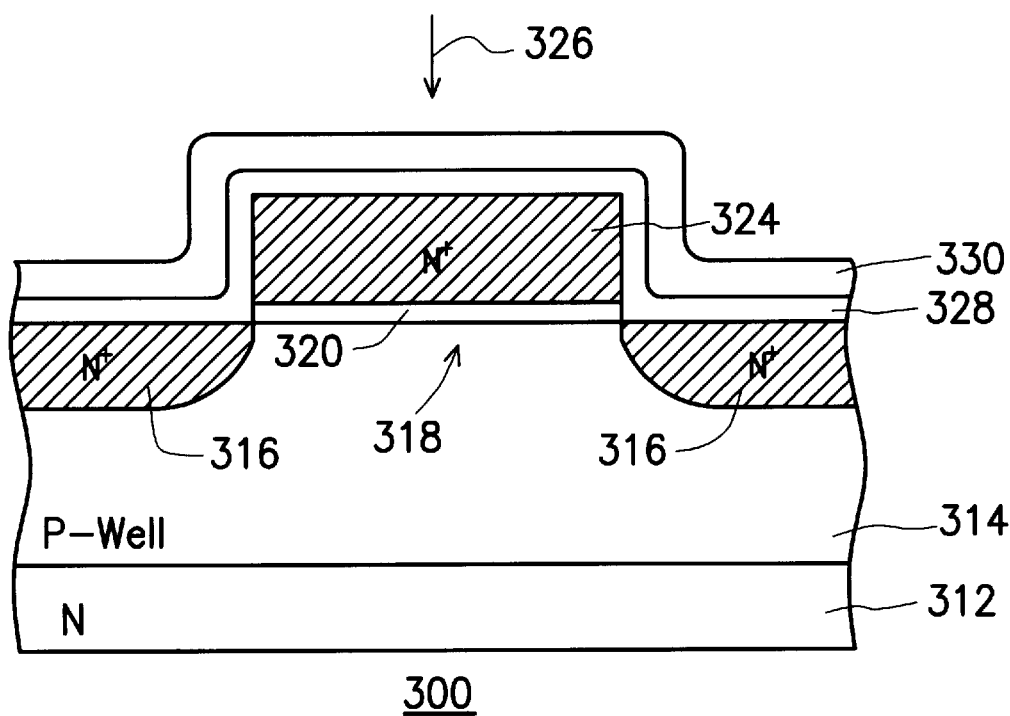

Next, in FIG. 4b, the conducting layer 322 is patterned, and then N-type ions 326 are doped forming an $N^+$ gate 324 above the channel 318. The $N^+$ source/drain regions 316 and the $N^+$ gate 324 are equivalent to the source terminal 12, the drain terminal 20 and the gate terminal 18 respectively of transistor Q1 in FIG. 1. Thereafter, a second gate oxide layer 328 and a polysilicon layer 330 are sequentially formed above the P-well. The second gate oxide layer 328 has a thickness of, for example, about 50 Å to 400 Å.

Figure 4C:
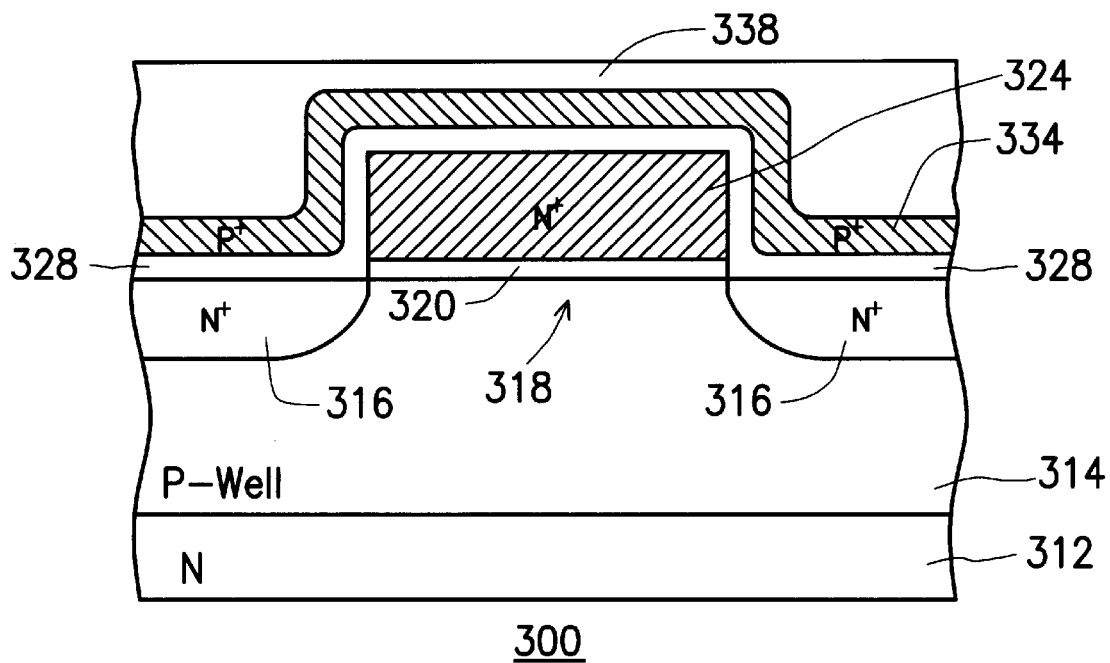

Subsequently, as shown in FIG. 4c, P-type ions 332 are doped into the polysilicon layer 330, forming P$^+$ source/drain regions 334 of the thin film transistor, for example, like the drain terminal 30 of transistor Q4 in FIG. 1. Next, an inter-layer dielectric (ILD) layer 338 is formed and then planarized covering the P$^+$ source/drain terminals 334 and the thin film transistor channel 336.

Figure 4D:
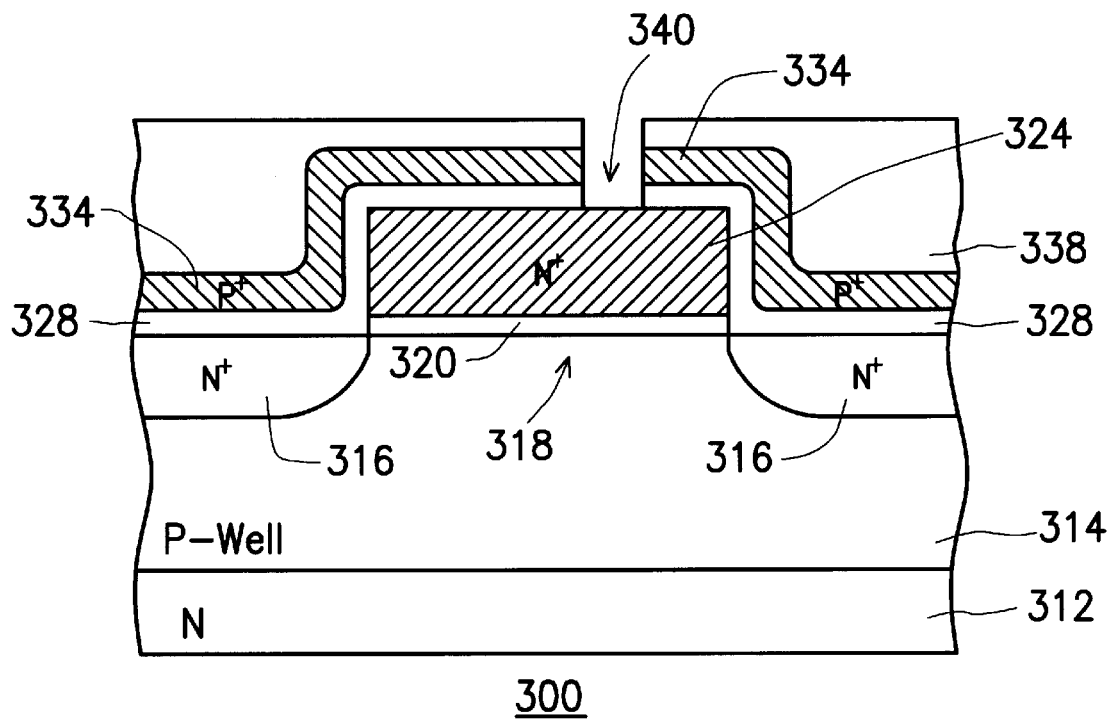

Then, as shown in FIG. 4d, the inter-layer dielectric layer 338 and the polysilicon layer 330 are patterned so as to etch out an opening 340 exposing the first N$^+$ gate.

Figure 4E:
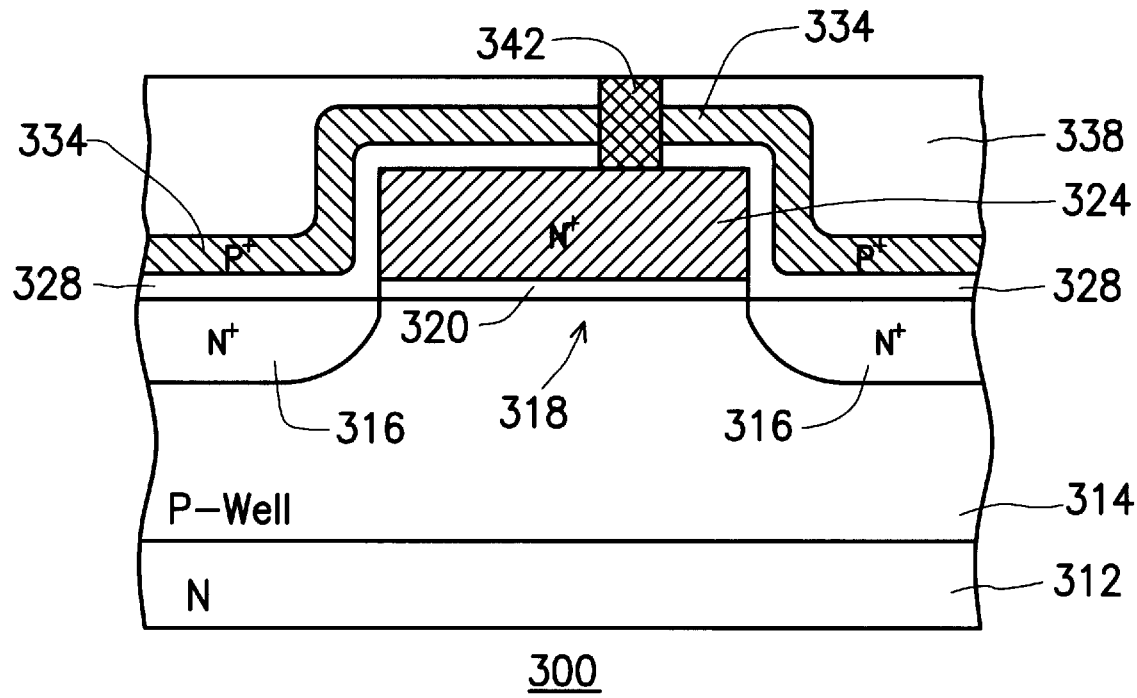

In FIG. 4e, a tungsten layer (not shown in the figure) is formed filling up the opening 340. Then, the tungsten layer is etched back using the inter-layer dielectric layer 338 as the etching stop layer and forming a tungsten plug 342.

Figure 4F:
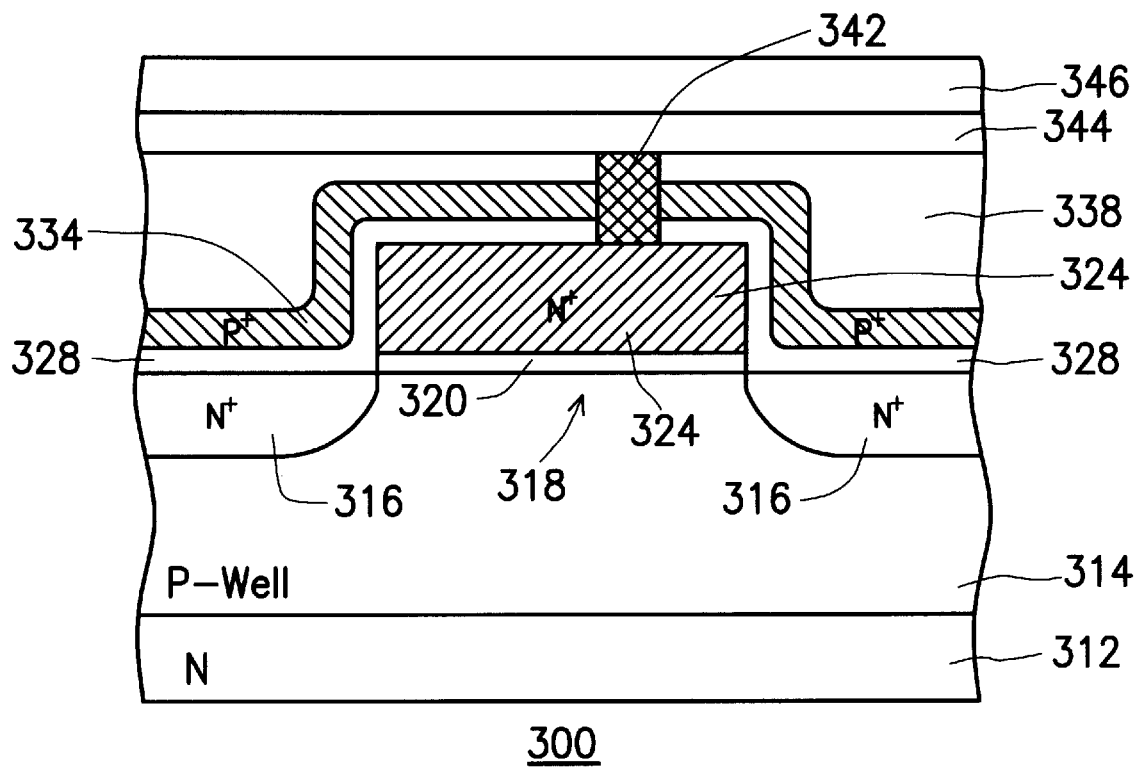

Finally, in FIG. 4f, a metal layer 344 and an inter-metallic dielectric (IMD) layer 346 are sequentially formed, followed by the subsequent back-end processes necessary for the completion of the SRAM component.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a via for linking up the drain of a load transistor with the gate of a driver transistor in a SRAM unit, comprising of the steps of:

providing an N-type silicon substrate, and forming a P-well above the N-type silicon substrate having N$^+$ source/drain regions separated by a channel;

forming a first gate oxide layer and a conducting layer sequentially above the P-well;

defining a pattern on the conducting layer, and then doping N-type ions to form an N$^+$ gate above the channel;

forming a second gate oxide layer and a polysilicon layer sequentially above the P-well;

doping P-type ions into the polysilicon layer to form P$^+$ source/drain terminals;

patterning the polysilicon layer and the second gate oxide layer so as to etch out an opening exposing part of the first gate layer;

forming a metallic layer filling up the opening, and then etching back the metallic layer to form a metallic plug; and forming an inter-layer dielectric layer.

2. A method according to claim 1, wherein the first gate oxide layer is a silicon dioxide layer.

3. A method according to claim 1, wherein the conducting layer is a polycide layer made from a combination of a polysilicon layer and a metal silicide layer.

4. A method according to claim 1, wherein the thickness of the gate oxide layer is about 50 Å to 400 Å.

5. A method according to claim 1, wherein the metallic layer is a tungsten layer.

6. A method according to claim 1, wherein the plug is formed by etching back the metallic layer.

7. A method according to claim 1, wherein the plug is formed by applying a chemical-mechanical polishing method to grind down the metallic layer.

8. A manufacturing method for forming a via connecting to the thin film transistor in a SRAM unit, comprising the steps of:

providing an N-type silicon substrate, and forming a P-well above the N-type silicon substrate having N$^+$ source/drain regions separated by a channel;

forming a first gate oxide layer and a conducting layer sequentially above the P-well;

defining a pattern on the conducting layer, and then doping N-type ions to form an N$^+$ gate above the channel;

forming a second gate oxide layer and a polysilicon layer sequentially above the P-well;

doping P-type ions into the polysilicon layer to form P$^+$ source/drain terminals;

forming an inter-layer dielectric layer above the polysilicon layer;

patterning the inter-layer dielectric layer, the polysilicon layer and the second gate oxide layer so as to etch out an opening exposing part of the first gate layer;

forming a metallic layer filling the opening, and then etching back the metallic layer to form a metallic plug;

forming a another metallic layer followed by planarization thereof; and forming an inter-metallic dielectric layer above the metallic layer.

9. A method according to claim 8, wherein the first gate oxide layer is a silicon dioxide layer.

10. A method according to claim 8, wherein the conducting layer is a polycide layer made from a combination of a polysilicon layer and a metal silicide layer.

11. A method according to claim 8, wherein the thickness of the gate oxide layer is about 50 Å to 400 Å.

12. A method according to claim 8, wherein the metallic layer is a tungsten layer.

13. A method according to claim 8, wherein the plug is formed by etching back the metallic layer.

14. A method according to claim 8, wherein the plug is formed by applying a chemical-mechanical polishing method to grind down the metallic layer.

15. A method according to claim 8, wherein the plug functions both as a via and a contact window, and saving a processing step as well as the production cost of making a photomask.

* * * * *